(12) United States Patent
Du et al.

(10) Patent No.: US 9,735,073 B1
(45) Date of Patent: Aug. 15, 2017

(54) TFT SWITCH AND METHOD FOR MANUFACTURING THE SAME

(71) Applicant: Shenzhen China Star Optoelectronics Technology Co., Ltd., Shenzhen, Guangdong (CN)

(72) Inventors: Peng Du, Guangdong (CN); Cheng-hung Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/058,174

(22) Filed: Mar. 2, 2016

Related U.S. Application Data

(62) Division of application No. 14/119,189, filed on Nov. 20, 2013, now abandoned.

(51) Int. Cl.
| | |
|---|---|
| *H01L 23/58* | (2006.01) |
| *H01L 21/66* | (2006.01) |
| *H01L 27/12* | (2006.01) |
| *H01L 29/786* | (2006.01) |

(52) U.S. Cl.
CPC .......... *H01L 22/34* (2013.01); *H01L 22/14* (2013.01); *H01L 27/127* (2013.01); *H01L 27/1244* (2013.01); *H01L 29/78609* (2013.01); *H01L 29/78648* (2013.01); *H01L 29/78696* (2013.01)

(58) Field of Classification Search
None
See application file for complete search history.

(56) References Cited

U.S. PATENT DOCUMENTS

| | | | | |
|---|---|---|---|---|
| 2008/0251787 | A1* | 10/2008 | Kim | H01L 22/32 257/48 |
| 2010/0025676 | A1* | 2/2010 | Yamazaki | H01L 29/7869 257/43 |
| 2010/0032667 | A1* | 2/2010 | Yamazaki | H01L 29/7869 257/43 |
| 2010/0117079 | A1* | 5/2010 | Miyairi | H01L 27/1225 257/43 |
| 2012/0161127 | A1* | 6/2012 | Kato | G11C 11/404 257/43 |
| 2012/0228607 | A1* | 9/2012 | Miyairi | H01L 27/1225 257/43 |
| 2015/0041801 | A1* | 2/2015 | Yamazaki | H01L 29/792 257/43 |

* cited by examiner

*Primary Examiner* — Sitaramarao S Yechuri
(74) *Attorney, Agent, or Firm* — Andrew C. Cheng

(57) ABSTRACT

A thin-film transistor (TFT) switch includes a gate, a drain, a source, a semiconductor layer, and a fourth electrode. The drain is connected to a first signal. The gate is connected to a control signal to control the switch on or off. The source outputs the first signal when the switch turns on. The fourth electrode and the gate are respectively located at two sides of the semiconductor layer. The fourth electrode is conductive and is selectively coupled to different voltage levels, thereby reducing leakage current in a channel to improve switch characteristic when the switch turns off.

8 Claims, 4 Drawing Sheets

TFT SWITCH AND METHOD FOR MANUFACTURING THE SAME

CROSS REFERENCE TO RELATED APPLICATIONS

This is a divisional application of co-pending patent application Ser. No. 14/119,189, "TFT Switch and Method for Manufacturing the Same", filed on Nov. 20, 2013.

BACKGROUND OF THE INVENTION

1. Field of the Invention

The present invention relates to a liquid crystal display (LCD) technology field, and more particularly, to a thin film transistor (TFT) switch and a method for manufacturing the same.

2. The Related Arts

In detection of an LCD panel, there are two common designs for detecting circuits. One is that a detecting circuit is directly coupled to scanning lines or data lines in a display area of the panel, and it needs to cut a connection between a test circuit and a circuit in the display area by using laser after the detection. The other is that the test circuit is coupled to a signal line in the display area via a TFT switch. A signal is fed to the display area through the TFT switch when a high voltage level is applied to a gate of the TFT switch to turn it on. On the contrary, since the TFT switch turns off for disconnection between the test line and the scanning or data line in response to a low voltage level applied on the gate of the TFT switch when the panel operates normally, a process of laser cutting is therefore omitted.

Conventionally, there are three electrodes of the TFT switch for detecting circuits, i.e. a gate, a drain and a source. The gate of the TFT is in negative bias in a long term when the panel works normally, and therefore electrical characteristic of the semiconductor layer of the TFT varies to increase leakage current. FIG. 1 shows a circuit diagram of a conventional switch TFT. As shown in FIG. 1, a shorting bar is connected to drains 11 and 14 of the two TFTs. Sources 12 and 15 of the two TFTs are respectively connected to different scanning lines (GL) or data tines (DL). When two gates 13 and 16 of the TFTs are applied with a low voltage, the two TFTs switch off. If a leakage current passing through the two TFTs and the shorting bar occurs, a short circuit between the different scanning lines or data lines, i.e. a short circuit between different signals, happens and deteriorates display quality.

SUMMARY OF THE INVENTION

The present invention provides a TFT switch and the method of manufacturing the same for reducing leakage current in a channel of the TFT switch to improve switch characteristic when the switch turns off.

According to the present invention, a thin film transistor (TFT) switch comprises a gate, a drain, a source, a semiconductor layer, and a fourth electrode. The drain is connected to a first signal. The gate is connected to a control signal to control the switch on or off. The source outputs the first signal when the switch turns on. The fourth electrode and the gate are respectively located at two sides of the semiconductor layer. The fourth electrode is conductive and is selectively connected to different voltage levels.

In one aspect of the present invention, the gate and the fourth electrode are connected to a high voltage level when the switch turns on.

In another aspect of the present invention, the voltage level of the fourth electrode is identical to that of the gate.

In another aspect of the present invention, the voltage level of the fourth electrode is different from that of the gate.

In another aspect of the present invention, the TFT switch further comprises a passivation layer and a gate insulating layer between the gate and the semiconductor layer. The drain and the source are located between the semiconductor layer and the passivation layer. The fourth electrode is located on the passivation layer. When the switch turns off, the gate is connected to a low voltage level. The fourth electrode is connected to a high voltage level to conduct accumulated electrons away from the gate side in the semiconductor layer and afterwards connected to the low voltage level.

In another aspect of the present invention, a voltage level of the fourth electrode is identical to that of the gate when the fourth electrode is connected to the low voltage level.

In still another aspect of the present invention, a voltage level of the fourth electrode is different to that of the gate when the fourth electrode is connected to the low voltage level.

In still another aspect of the present invention, the TFT switch further comprises a passivation layer and a gate insulating layer on the gate. The drain and the source are located between the gate insulating layer and the semiconductor layer. The fourth electrode is located on the semiconductor layer. The passivation layer surrounds the fourth electrode. When the switch turns off, the gate is connected to a low voltage level, and the fourth electrode is grounded to conduct accumulated electrons away from the gate side in the semiconductor layer.

In yet another aspect of the present invention, the first signal is a test signal, and the source is connected to a scanning or data line under test.

According to the present invention, a method for manufacturing a TFT switch comprises forming a gate connected to a control signal to control the TFT switch turning on or turning off, and a gate insulating layer on a substrate in order; forming a semiconductor layer on the gate insulating layer; forming a drain connected to a first signal and a source on the semiconductor layer, respectively, and covering the semiconductor layer with a passivation layer; and forming a fourth electrode on the passivation layer, wherein the fourth electrode is selectively connected to different voltage levels.

According to the present invention, a method for manufacturing a TFT switch comprises: forming a gate connected to a control signal to control the switch on or off, and a gate insulating layer on a substrate in order; forming a drain connected to a first signal, and a source on the gate insulating layer respectively; forming a semiconductor layer on the drain and the source to contact the gate insulating layer; and forming a fourth electrode on the semiconductor layer and covering and surrounding the fourth electrode with a passivation layer, wherein the fourth electrode is selectively connected to different voltage levels.

The benefit of the present invention is that in addition to a gate, a drain and a source inherent to a conventional TFT switch, a fourth electrode is added in the TFT switch. The drain is coupled to a first signal, and the gate is coupled to a control signal to control the switch turning on or off. The first signal is outputted from the source when the switch turns on. The fourth electrode and the gate are respectively locate at two sides of a semiconductor layer. The fourth electrode is conductive and is selectively coupled to different voltage levels, thereby reducing leakage current in a channel to improve switch characteristic when the switch turns off.

DETAILED DESCRIPTION OF THE PREFERRED EMBODIMENTS

Figure 1:
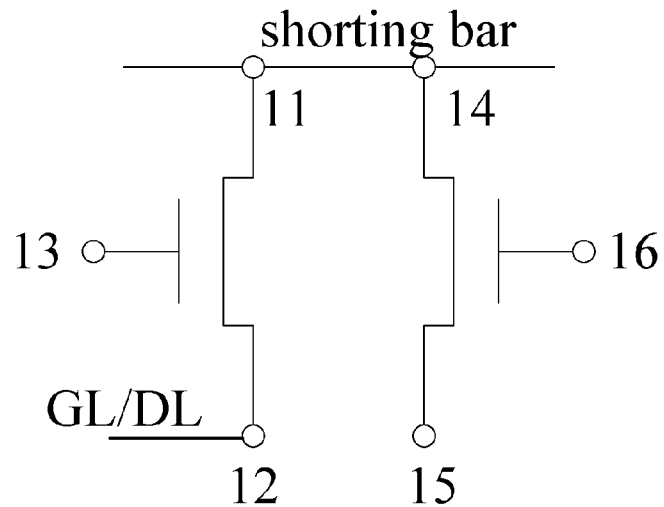
FIG. 1 shows a circuit diagram of a conventional switch TFT.
Figure 2:
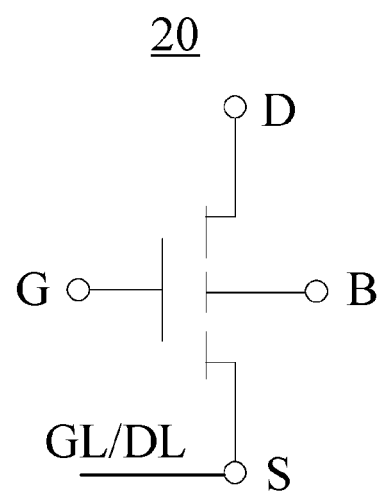
FIG. 2 shows a TFT switch according to a first embodiment of the present invention.

Please refer to FIG. 2. FIG. 2 shows a TFT switch according to a first embodiment of the present invention. As shown in FIG. 2, a TFT switch 20 comprises a gate G, a drain D, a source S, a semiconductor layer 23 among the gate G, the drain D and the source S, and a fourth electrode B. The drain D is connected to a first signal, and the gate G is connected to a control signal to control the switch 20 turning on or turning off. The first signal is outputted from the source S when the switch 20 turns on. The fourth electrode B and the gate G are respectively locate at two sides of the semiconductor layer 23. The fourth electrode B is selectively connected to different voltage levels. The gate G, the drain D, the source S and the fourth electrode B are made of a conductive material.

In the present invention, the TFT switch 20 can be applied to different circuits like a TFT switch coupled to a pixel electrode, a test circuit, or a layout circuit of an active-matrix LCD. Preferably, the TFT switch 20 is for use in the test circuit. At this time, the first signal connected to the drain D is a test signal, and the drain S is connected to the circuit under test, which is data line DL or scanning line GL. The following takes a TFT switch applied to the test circuit as an example.

In the embodiment, the gate G and the fourth electrode B are connected to a high voltage level when the switch 20 turns on. At this time, the voltage level of the fourth electrode B is either the same as or different from that of the gate G. It is noted that the difference between the two voltage levels is in a limited range. When the switch 20 is to turn off, the gate G is connected to low voltage level, and the fourth electrode B is selectively connected to different voltage levels for conducting the leakage current far away from the gate G side in the semiconductor layer 23. And, then, the fourth electrode B is also connected to low voltage level. The voltage level of the fourth electrode B is either the same as or different from that of the gate G. It is noted that the difference between the two voltage levels is in a limited range.

Figure 3:
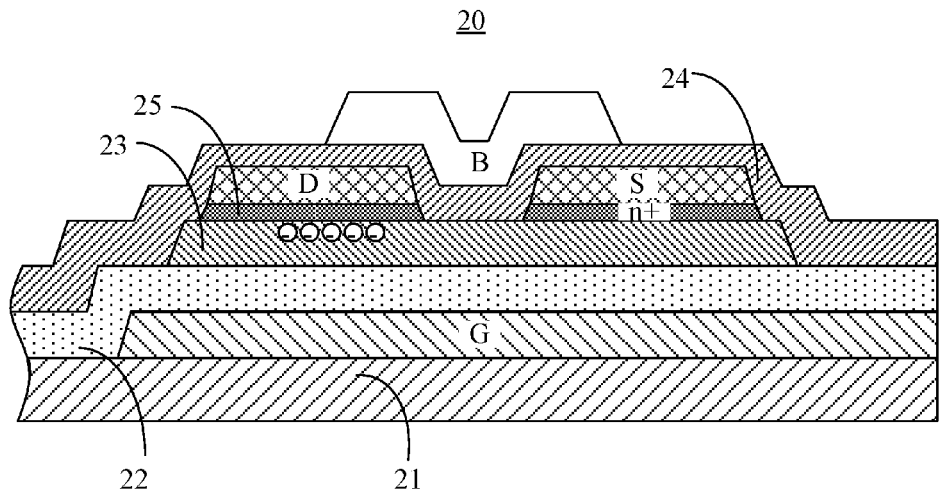
FIG. 3 is a cross-sectional view of the TFT switch according to the first embodiment of the present invention.

FIG. 3 is a cross-sectional view of the TFT switch according to the first embodiment of the present invention. As illustrated in FIG. 3, the switch 20 is structured to arrange the gate G on a base 21, a gate insulating layer 22 on the gate G, and the semiconductor layer 23 on the gate insulating layer 22. Both of the drain D and the source S are set up on the semiconductor layer 23 and separated by a passivation layer 24. The passivation layer 24 also covers the whole surface. The fourth electrode B is disposed over a gap between the drain D and the source S and extends onto the drain D and the source S. Two higher electron concentration n+ layers 25 are respectively set up between the drain D and the semiconductor layer 23 and between the source S and the semiconductor layer 23. The two n+ layers 25 are each a part of the drain D or the source S and greatly reduce channel resistance when the switch 20 turns on.

In the embodiment, the gate G is located at one side of the semiconductor layer 23 while the drain D and the source S are located at an opposite side of the semiconductor layer 23. The gate G is connected to a low voltage level and the fourth electrode B is connected to a high voltage level to conduct accumulated electrons away from the gate G side in the semiconductor layer 23 for reducing leakage current when the switch 20 turns off. The low voltage level of the fourth electrode B is either the same as or different from that of the gate G. It is noted that the difference between the two voltage levels is in a limited range. The situation that a transition from high to low voltage level applied to the fourth electrode B is similar to a transition from high to low voltage level applied to the gate G when the switch 20 turns off. Therefore, the electrons gathered at a location away from the gate G side in the semiconductor layer 23 are conducted off, similar to the electrons at a location close to the gate G side in the semiconductor layer 23.

Figure 4:
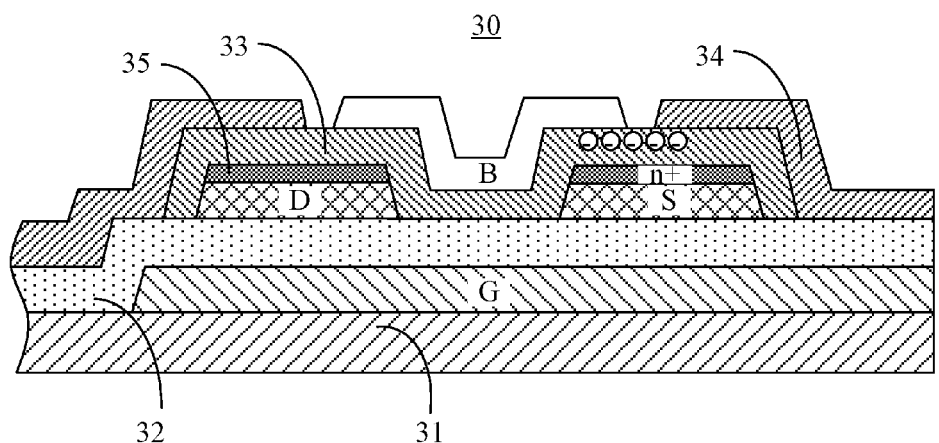
FIG. 4 is a cross-sectional view of a TFT switch according to a second embodiment of the present invention.

FIG. 4 is a cross-sectional view of a TFT switch according to a second embodiment of the present invention. As illustrated in FIG. 4, the switch 30 comprises a gate G on a base 11, a gate insulating layer 32 on the gate G. A drain D and a source S are set up on the gate insulating layer 32 and are separated by a semiconductor layer 33. The semiconductor layer 33 also covers the whole drain D and source S. A fourth electrode B is disposed over a gap between the drain D and the source S and extends onto the drain D and the source S but doe not cover the whole drain D and source S. The rest of the surface is covered by a passivation layer 34 surrounding the fourth electrode B and there is a certain gap between the passivation layer 34 and the fourth electrode B. Two higher electron concentration n+ layers 35 are respectively set up between the drain D and the semiconductor layer 33 and between the source S and the semiconductor layer 33. The two layers 35 are each a part of the drain D or the source S and greatly reduce channel resistance when the switch 30 turns on. The gate G, the drain D, the source S and the fourth electrode B are conductive.

In the embodiment, the gate G, the drain D and the source S are located at the same side of the semiconductor layer 33, and the fourth electrode B and the gate G are respectively located at two sides of the semiconductor layer 33. When the switch 30 turns off, the gate G is connected to a low voltage level and the fourth electrode B is grounded to conduct accumulated electrons away from the gate G side in the semiconductor layer 33 for reducing leakage current. When the fourth electrode B is connected to a low voltage level, electrons are directly conducted away from the side of the semiconductor layer 33 that is distant from the gate G, which is close to the fourth electrode B, via the fourth electrode B because the fourth electrode B directly contacts the semiconductor layer 33. The voltage level of the fourth electrode B is either the same as or different from that of the gate G. It is noted that the difference between the two voltage levels is in a limited range.

Figure 5:
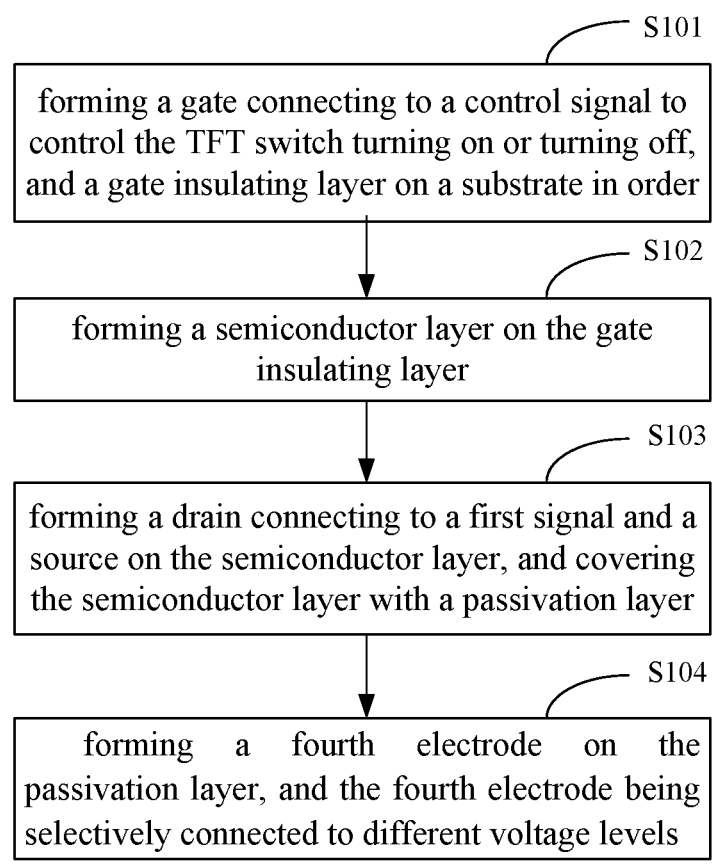
FIG. 5 is a flowchart of a manufacturing method for the TFT switch shown in FIG. 3.

Please refer to FIG. 5. FIG. 5 is a flowchart of a manufacturing method for the TFT switch shown in FIG. 3. As shown in FIG. 5, the manufacturing method for the TFT switch comprises the following steps:

Step S101: forming a gate, for connecting to a control signal to control a switch on or off, and a gate insulating layer on a substrate in order.

Step S102: forming a semiconductor layer on the gate insulating layer.

Step S103: forming a drain, for connecting to a first signal, and a source on the semiconductor layer respectively and covered with a passivation layer. When the TFT switch is used in a test circuit, the first signal is a test signal and the drain connects to the test circuit. The test circuit is either a data line or a scanning line.

Step S104: forming a fourth electrode on the passivation layer, wherein the fourth electrode is selectively connected to different voltage levels.

In the embodiment, the gate is located at one side of the semiconductor layer while the drain and the source are located at an opposite side of the semiconductor layer. The fourth electrode and the gate are connected to high voltages when the switch turns on, and the voltage of the fourth electrode is either identical to or different from that of the gate. The gate is connected to a low voltage, and the fourth electrode is connected to a high voltage to conduct accumulated electrons away from the gate side in the semiconductor layer for reducing leakage current when the switch turns off. Afterwards, the fourth electrode is connected to a low voltage, and the voltage of the fourth electrode is either identical to or different from that of the gate. It is noted that the difference between the two voltage levels is in a limited range.

Figure 6:
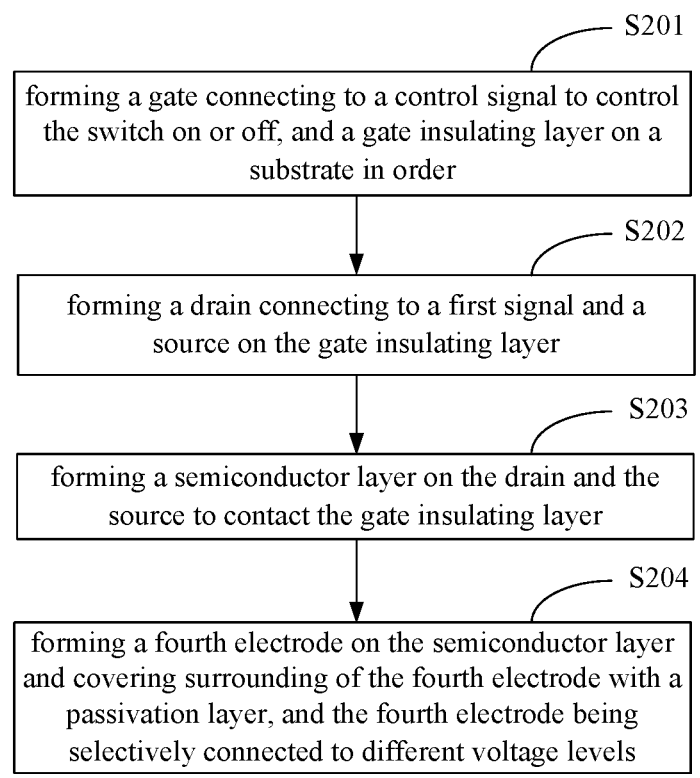
FIG. 6 is a flowchart of a manufacturing method for the TFT switch shown in FIG. 4.

Please refer to FIG. 6. FIG. 6 is a flowchart of a manufacturing method for the TFT switch shown in FIG. 4. As shown in FIG. 6, the manufacturing method for the TFT switch comprises the following steps:

Step S201: forming a gate, for connecting to a control signal to control a switch on or off, and a gate insulating layer on a substrate in order.

Step S202: forming a drain, for connecting to a first signal, and a source on the gate insulating layer respectively. When the TFT switch is used in a test circuit, the first signal is a test signal, and the source is used for connecting to the circuit under test. The test circuit is either a data line or a scanning line.

Step S203: forming a semiconductor layer on the drain and the source and contacting the gate insulating layer.

Step S204: forming a fourth electrode on the semiconductor layer and covering the surrounding of the fourth electrode with the passivation layer, and the fourth electrode is selectively connected to different voltage levels.

In the embodiment, the gate, the drain, and the source are located at the same side of the semiconductor layer. The fourth electrode and the gate are connected to high voltages when the switch turns on, and the voltage of the fourth electrode is either identical to or different from that of the gate. The gate is connected to a low voltage, and the fourth electrode is grounded to conduct electrons away from the gate side in the semiconductor layer for reducing leakage current when the switch turns off. The voltage of the fourth electrode is either identical to or different from that of the gate after the switch turns off. It is noted that the difference between the two voltage levels is in a limited range.

In summary, the present invention provides a TFT switch, which comprises a gate, a drain, a source, and a fourth electrode. The drain is connected to a first signal, and the gate is connected to a control signal to control the switch on or off. The source transmits the first signal when the switch turns on. The fourth electrode and the gate are located at two sides of the source and the drain. The fourth electrode is conductive and is selectively connected to different voltage levels, thereby reducing leakage current in a channel to improve switch characteristic when the switch turns off.

Those skilled, in the art will readily observe that numerous modifications and alterations of the device may be made while retaining the teachings of the invention. Accordingly, the above disclosure should be construed as limited only by the metes and bounds of the appended claims.

What is claimed is:

1. A thin film transistor (TFT) switch, comprising a gate, a gate insulation layer formed on the gate, a drain and a source formed on the gate insulation layer and spaced from each other by a gap therebetween, a semiconductor layer formed on the gate insulation layer, the drain and the source, an n+ layer formed between the semiconductor layer and each of the source and the drain, and a fourth electrode formed on and in direct contact with the semiconductor layer and located above the gap between the drain and the source, wherein the drain is adapted to connect with a first signal and the gate is adapted to connect with a control signal to selectively control the TFT switch on or off so that the source outputs the first signal when the switch turns on; wherein the fourth electrode and the gate are respectively located at opposite sides of the semiconductor layer; wherein when the switch turns on, the gate and the fourth electrode are connected to high voltage levels; and wherein the first signal is a test signal and the source is adapted to connect to a data line under test;

wherein the high voltage level to which the fourth electrode is connected is identical to the high voltage level to which the gate is connected.

2. The TFT switch as claimed in claim 1 further comprising a passivation layer formed on the semiconductor layer and surrounding the fourth electrode in such a way that a gap is present between the passivation layer and the fourth electrode.

3. The TFT switch as claimed in claim 1, wherein when the TFT switch turns off, the gate is connected to a low voltage level and the fourth electrode is grounded to drain off electrons that are accumulated in the semiconductor layer at a location distant from the gate.

4. A method for manufacturing a thin-film transistor (TFT) switch, comprising the following steps:

forming, in sequence, a gate and a gate insulation layer on a base, wherein the gate is adapted to connect with a control signal for selectively switching the TFT switch on or off;

forming a drain and a source on the gate insulation layer;

forming a semiconductor layer on the drain and the source in such a way as to contact the gate insulating layer, wherein an n+ layer is formed between the semiconductor layer and each of the drain and the source and wherein the drain is adapted to connect with a first signal so that when the TFT turns on, the source outputs the first signal; and forming a fourth electrode on the semiconductor layer such that the fourth electrode is in direct contact with the semiconductor layer and forming a passivation layer on the semiconductor layer such that the passivation layer surrounds the fourth electrode, wherein the fourth electrode is adapted to selectively connect with different voltage levels; wherein when the TFT switch turns on, the gate and the fourth electrode are set at high voltage levels; and wherein the first signal is a test signal and the source is connected to a data line under test;

wherein the high voltage level of the fourth electrode is identical to the high voltage level of the gate when the TFT switch turns on.

5. The method as claimed in claim 4, wherein when the TFT switch turns off, the gate is connected to a low voltage level and the fourth electrode is grounded to drain off electrons that are accumulated in the semiconductor layer at a location distant from the gate.

6. A thin film transistor (TFT) switch, comprising a gate, a gate insulation layer formed on the gate, a drain and a source formed on the gate insulation layer and spaced from each other by a gap therebetween, a semiconductor layer formed on the gate insulation layer, the drain and the source, an n+ layer formed between the semiconductor layer and each of the source and the drain, and a fourth electrode formed on and in direct contact with the semiconductor layer and located above the gap between the drain and the source, wherein the drain is adapted to connect with a first signal and the gate is adapted to connect with a control signal to selectively control the TFT switch on or off so that the source outputs the first signal when the switch turns on; wherein the fourth electrode and the gate are respectively located at opposite sides of the semiconductor layer; wherein when the switch turns on, the gate and the fourth electrode are connected to high voltage levels; and wherein the first signal is a test signal and the source is adapted to connect to a data line under test;

wherein when the TFT switch turns off, the gate is connected to a low voltage level and the fourth electrode is grounded to drain off electrons that are accumulated in the semiconductor layer at a location distant from the gate.

7. The TFT switch as claimed in claim 6, wherein the high voltage level to which the fourth electrode is connected is different from the high voltage level to which the gate is connected.

8. The TFT switch as claimed in claim 6 further comprising a passivation layer formed on the semiconductor layer and surrounding the fourth electrode in such a way that a gap is present between the passivation layer and the fourth electrode.

* * * * *